(12) United States Patent
Cognetti et al.

(10) Patent No.: US 7,479,659 B2
(45) Date of Patent: Jan. 20, 2009

(54) PROCESS FOR MANUFACTURING ENCAPSULATED OPTICAL SENSORS, AND AN ENCAPSULATED OPTICAL SENSOR MANUFACTURED USING THIS PROCESS

(75) Inventors: Carlo Cognetti, Milan (IT); Ubaldo Mastromatteo, Bareggio (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 88 days.

(21) Appl. No.: 10/446,589

(22) Filed: May 27, 2003

(65) Prior Publication Data

US 2004/0031973 A1 Feb. 19, 2004

(30) Foreign Application Priority Data

May 27, 2002 (EP) .................................. 02425334

(51) Int. Cl.
*H01L 27/15* (2006.01)
(52) U.S. Cl. .................... 257/81; 438/25; 257/E31.058; 257/E33.001; 257/E51.018
(58) Field of Classification Search .................. 257/433, 257/432, 434, 698, 704, 80–82, 98–100, 257/414, 7, E31.058, E33.001, E51.018; 438/25
See application file for complete search history.

(56) References Cited

U.S. PATENT DOCUMENTS

| 4,369,458 A | 1/1983 | Thomas et al. |
| 5,006,711 A | 4/1991 | Hamashima et al. |
| 5,397,897 A | 3/1995 | Komatsu et al. |
| 5,798,557 A * | 8/1998 | Salatino et al. ............. 257/416 |
| 5,811,799 A | 9/1998 | Wu |
| 5,841,128 A * | 11/1998 | Shibuya et al. ........... 250/208.1 |
| 6,114,191 A * | 9/2000 | Young et al. ................. 438/125 |
| 6,225,664 B1 * | 5/2001 | Endo et al. ................... 257/347 |
| 6,483,179 B2 | 11/2002 | Iizima et al. |
| 6,614,743 B1 * | 9/2003 | Nakanishi et al. ........... 369/121 |
| 6,624,003 B1 * | 9/2003 | Rice ........................... 438/106 |
| 6,768,205 B2 * | 7/2004 | Taniguchi et al. ........... 257/774 |
| 6,815,808 B2 * | 11/2004 | Hyodo et al. ................ 257/678 |
| 2003/0080434 A1 | 5/2003 | Wataya |
| 2003/0123779 A1 | 7/2003 | Hashimoto |

FOREIGN PATENT DOCUMENTS

| EP | 0453372 A1 | 10/1991 |
| EP | 0697743 A1 | 2/1996 |
| EP | 02425334 | 12/2002 |
| JP | 6-334159 | 12/1994 |
| JP | 7-78951 | 3/1995 |
| JP | 2001-351997 | 12/2001 |
| WO | PCT/US94/14335 | 6/1995 |

* cited by examiner

*Primary Examiner*—Quoc D Hoang
(74) *Attorney, Agent, or Firm*—Lisa K. Jorgenson; Bryan A. Santarelli; Graybeal Jackson LLP

(57) ABSTRACT

A process for manufacturing encapsulated optical sensors, including the steps of: forming a plurality of mutually spaced optical sensors in a wafer of semiconductor material; bonding a plate of transparent material to the wafer so as to seal the optical sensors; and dividing the wafer into a plurality of dies, each comprising an optical sensor and a respective portion of the plate.

18 Claims, 5 Drawing Sheets

_US 7,479,659 B2_

PROCESS FOR MANUFACTURING ENCAPSULATED OPTICAL SENSORS, AND AN ENCAPSULATED OPTICAL SENSOR MANUFACTURED USING THIS PROCESS

PRIORITY CLAIM

This application claims priority from European patent application No. 02425334.6, filed May 27, 2002, which is incorporated herein by reference.

TECHNICAL FIELD

The present invention relates generally to a process for manufacturing an encapsulated optical sensor, and an encapsulated optical sensor manufactured using this process.

BACKGROUND OF THE INVENTION

As is known in today's electronics industry, there is an increasingly marked trend towards integrating a number of devices in a single multifunctional system. For example, the field of mobile telephones is undergoing an extremely rapid evolution, and one of the most important lines of development envisages the integration of a miniaturized videocamera in a cellular phone.

For this purpose, it is necessary to design optical sensors which, on the one hand, present overall dimensions that are as small as possible and are simple and inexpensive to manufacture, and which, on the other hand, will have optical characteristics that will not degrade the quality of the images that are detected. For this reason, the optical sensors must also be protected against contamination by external agents, such as dust and humidity, which could lead to irreparable damage. In particular, optical sensors are normally sealed inside hollow encapsulation structures. For greater clarity of exposition, we shall refer to FIG. 1, where a sensor 1 is illustrated, for example, an array CMOS sensor, formed in a die of semiconductor material obtained by cutting a wafer (not shown herein). The sensor 1 is encapsulated in a protective structure 2, which comprises a base 3, for example, formed by a lamina of pre-set thickness, and a supporting frame 4 of ceramic or plastic material, formed on the base 3 and having a depth greater than that of the sensor 1. In greater detail, the supporting frame 4 and the base 3 define a cavity 5, in which the sensor 1 is housed. In addition, the cavity 5 is sealed by means of a plate 6 of transparent material, preferably glass, which is bonded to the supporting frame 4, at a distance from the sensor 1. The plate 6 protects the sensor 1 from contaminating agents, without altering the optical properties of the incident light beams. Connection lines 7 enable the contacts of the sensor 1 to be brought outside the protective structure 2, through the base 3, said contacts being formed on the face of the sensor 1 facing the plate 6.

Known processes for encapsulating optical sensors present, however, various drawbacks.

In the first place, the overall dimensions of the hollow protective structures are considerable as compared to the size of the optical sensor and cannot be reduced beyond a certain limit. In fact, the supporting frame 4 must be quite thick in order to enable bonding of the plate 6. Furthermore, between the supporting frame 4 and the sensor 1, it is necessary to provide a region of free-space, in which the connection lines 7 are formed. In practice, the protective structure 2 has a width and a length that may be even twice those of the sensor 1. It is, therefore, evident that the degree of miniaturization of devices incorporating sensors encapsulated in hollow protective structures is accordingly limited.

In the second place, it is very likely for impurities to penetrate inside the cavity 5 when the sensor 1 is being manufactured and mounted in the protective structure 2. In fact, the sensor 1 can be encapsulated only after the initial wafer has been divided into individual dies. On the other hand, it is known that, during the steps of cutting of the wafers, a considerable amount of dust is created. Furthermore, even in the most well-controlled production areas, there is inevitably present some dust which, during the steps of conveying, handling, and assembly, may deposit on top of the sensor 1. Given that, in this way, the quality of the images that can be detected may easily be impaired, many sensors have to be eliminated and, in practice, the overall output of the manufacturing process is other than optimal.

A further drawback is due to the wide tolerances that are to be envisaged in the steps of manufacturing the protective structure 2 and encapsulating the sensor 1. Since these tolerances render the process far from easily repeatable, successive processing steps must be optimized for each individual piece. In particular, in the manufacture of miniaturized video cameras, an optical assembly is coupled to the encapsulated sensor 1. More specifically, the optical assembly is bonded to the plate 6. On account of the intrinsic imprecision of the protective structures 2, it is not sufficient to use exclusively mechanical centering references prearranged during the manufacture of the sensor 1 and of the protective structure 2. Instead, it is necessary to carry out a laborious process for aligning the optical assembly with respect to the surface of the sensor 1, so that the optical axis will be orthogonal to said surface, and, subsequently, for focusing the optical assembly. As mentioned above, this process must be carried out for each individual piece manufactured and has a marked incidence on the overall cost of manufacture.

SUMMARY OF THE INVENTION

A purpose of an embodiment of the present invention is to provide an encapsulated optical device and a corresponding manufacturing process that will be free from the drawbacks described above.

According to this embodiment of the present invention, a process for manufacturing encapsulated optical sensors is provided, as well as an encapsulated optical sensor manufactured using this process.

BRIEF DESCRIPTION OF THE DRAWINGS

For a better understanding of the invention, there will now be described an embodiment provided purely by way of non-limiting example and with reference to the annexed drawings, in which.

DETAILED DESCRIPTION

Figure 1:
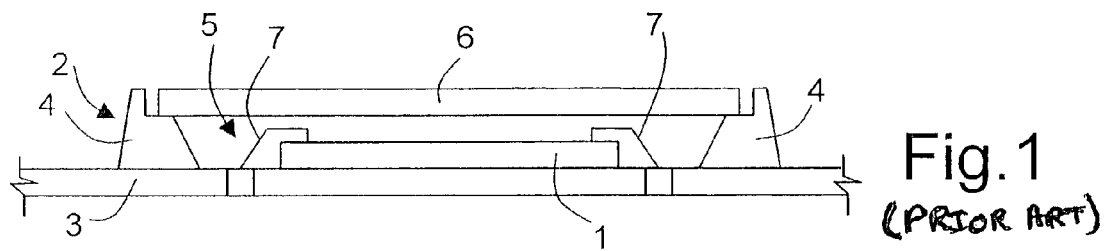
FIG. 1 is a cross section of a known encapsulated optical sensor.
Figure 2:
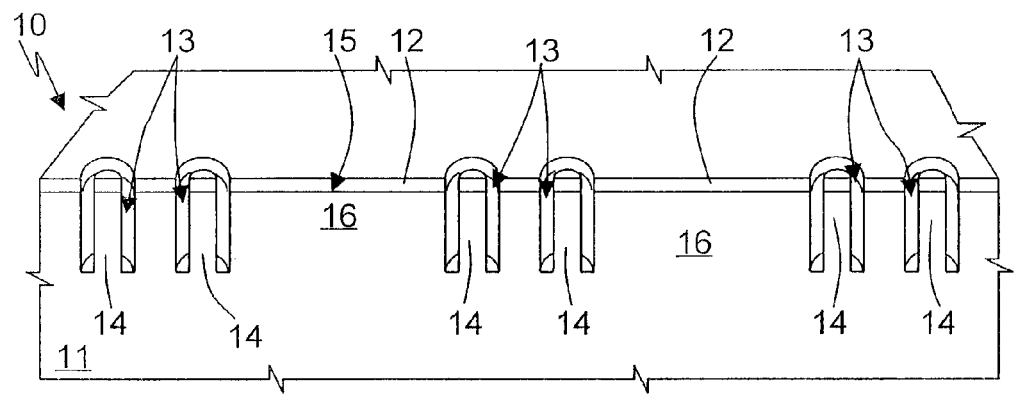
FIG. 2 is a perspective cross section through a wafer of semiconductor material in an initial step of the manufacturing process according to an embodiment of the present invention.

With reference to FIG. 2, a wafer 10 of semiconductor material, for instance, monocrystalline silicon, comprises a substrate 11, preferably with a low doping level; in particular, the substrate 11 is suitable for manufacturing integrated circuits and/or sensors. Using a mask 12, the substrate 11 is etched, and closed trenches 13 are dug, preferably having an annular shape. The trenches 13 delimit internally respective, low-conductivity, cylindrical regions or plugs 14 extending perpendicular to a front face 15 of the substrate 11 down to a pre-set depth, preferably of between 50 μm and 100 μm. In addition, the trenches 13 are distributed in pairs of parallel rows, along the edges of active areas 16 of pre-set width.

Figure 3:
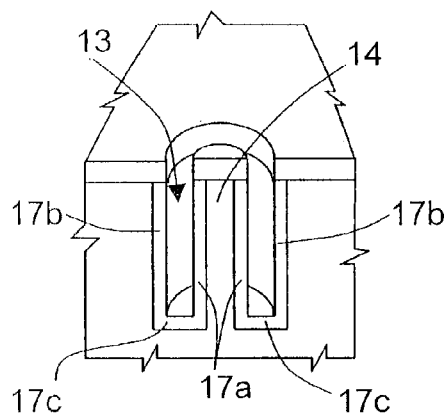
FIGS. 3 and 4 are perspective cross sections, at an enlarged scale, of the wafer of FIG. 2 in successive manufacturing steps according to an embodiment of the invention.
Figure 4:
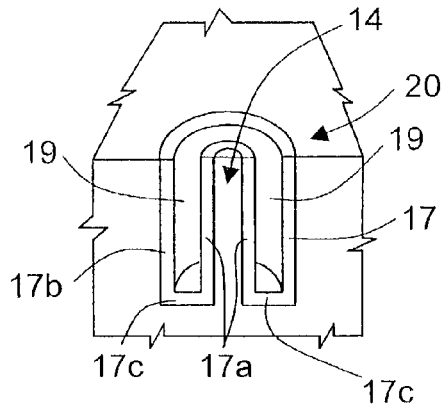

Then (FIG. 3), the substrate 11 is doped in an oven using the mask 12 to form highly-doped, highly-conductive regions 17 around the trenches 13. In greater detail, the highly conductive regions comprise inner annular portions 17a, outer annular portions 17b, and bottom portions 17c. The trenches 13 are then filled with a dielectric material, for example silicon dioxide, so as to obtain insulating structures 19 (FIG. 4) arranged between respective inner annular regions 17a and outer annular regions 17b. In practice, the plugs 14 have respective inner portions, which have a low doping level and are weakly conductive, and peripheral portions, which have a high doping level and are strongly conductive (the inner annular portions 17a). In addition, the plugs 14, which are insulated at the sides from the rest of the substrate 11, are designed to form through interconnections 20, as is clarified further below. The mask 12 is then removed, and the wafer 10 is planarized.

Figure 5:
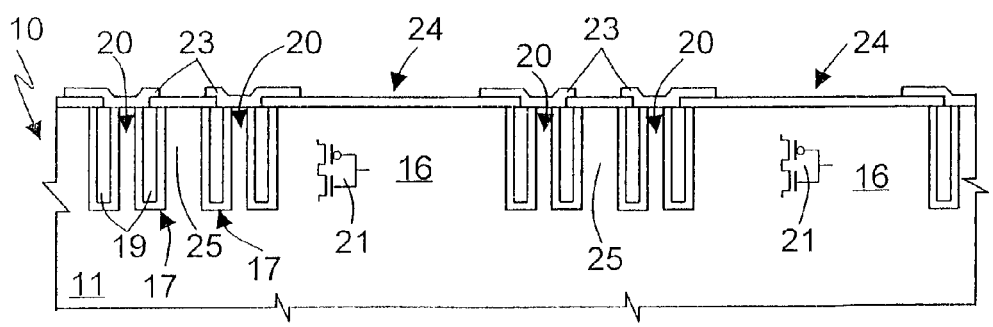
FIG. 5 is a cross section through the wafer of FIG. 4, in a subsequent manufacturing step according to an embodiment of the invention.
Figure 6:
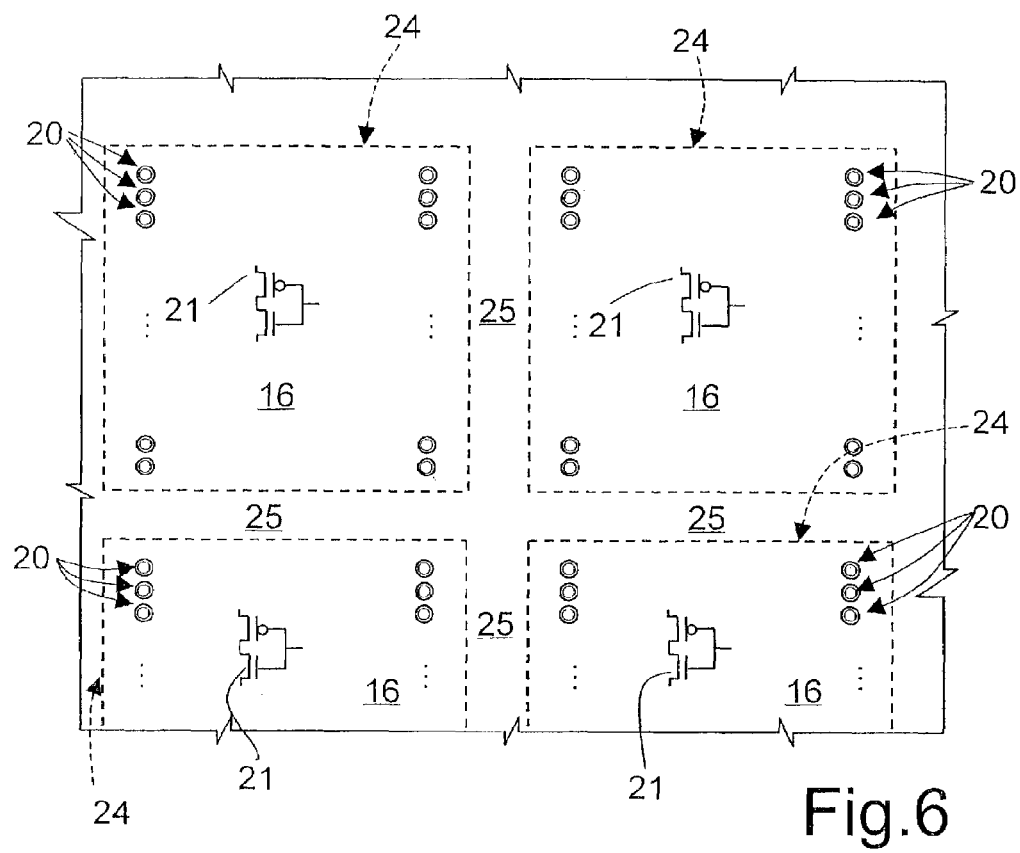
FIG. 6 is a top plan view of the wafer of FIG. 4 according to an embodiment of the invention.

By means of known manufacturing steps, active and/or passive components are then formed inside the active areas 16. In particular, CMOS photodetector arrays 21, represented schematically in FIG. 5, are formed. Then, metallization lines 23 are formed for connecting the photodetector arrays 21 to respective through interconnections 20. In FIG. 5, the metallization lines 23 are only partially illustrated for sake of simplicity. In practice, at this point, optical sensors 24 are formed in the wafer 10, each of which comprises a photodetector array 21 housed in a respective active area 16, and the through interconnections 20 are also formed adjacent to the active region 16 (see FIG. 6). In addition, adjacent optical sensors 24 are separated by cutting regions 25.

Figure 7:
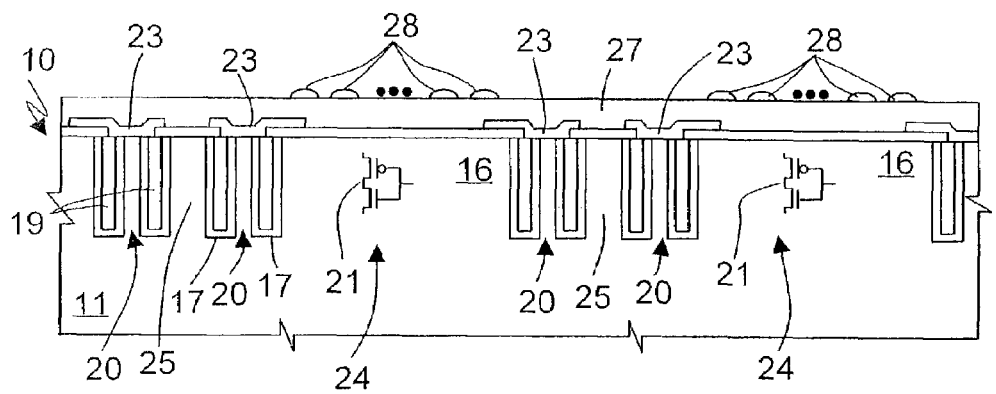
FIG. 7 is a cross section through the wafer of FIG. 5, in a subsequent manufacturing step according to an embodiment of the invention.

Then (FIG. 7), a transparent insulating layer 27, for example, made of silicon nitride, silicon oxynitride, or silicon dioxide, is deposited on the face 12 of the substrate 11 and the metallization lines 23. Then, on the insulating layer 27, and more precisely above the optical sensors 24, there are formed resin micro-lenses 28, each of which overlies a respective photodetector 21.

Figure 8:
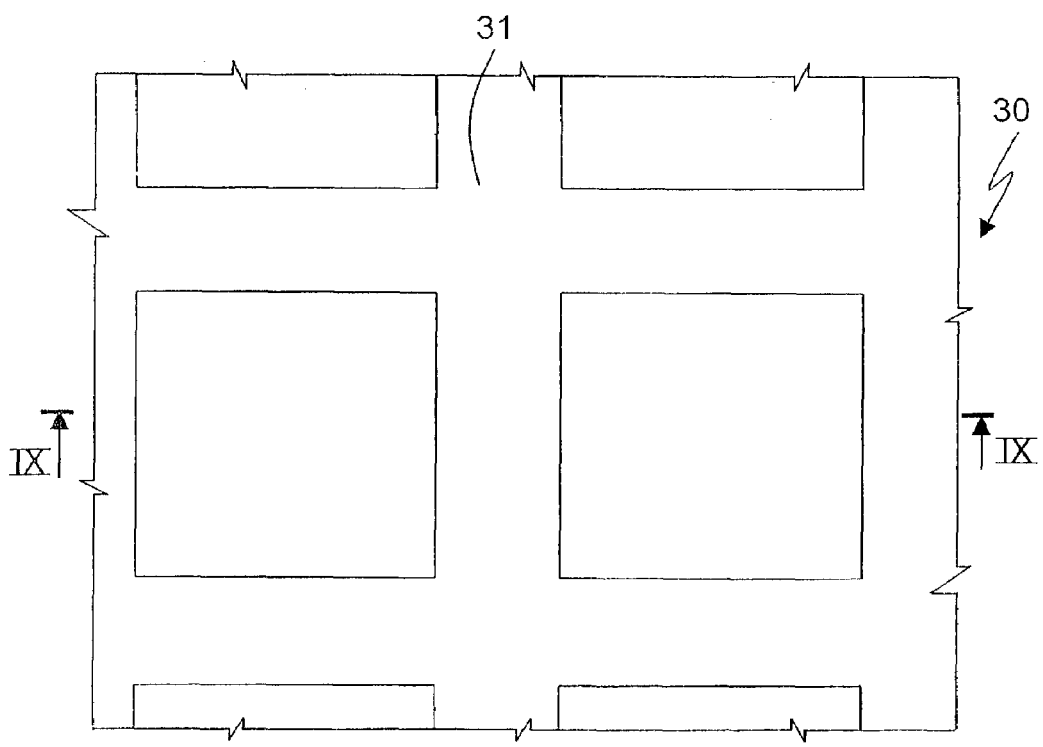
FIG. 8 is a top plan view of a transparent plate used in the present process according to an embodiment of the invention.
Figure 9:
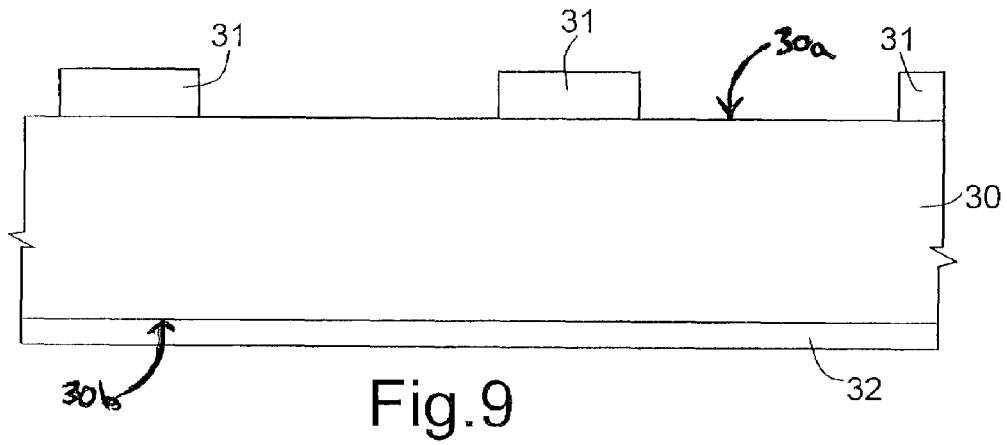
FIG. 9 is a front view of the plate of FIG. 8, sectioned along a plane of trace IX-IX according to an embodiment of the invention.
Figure 10:
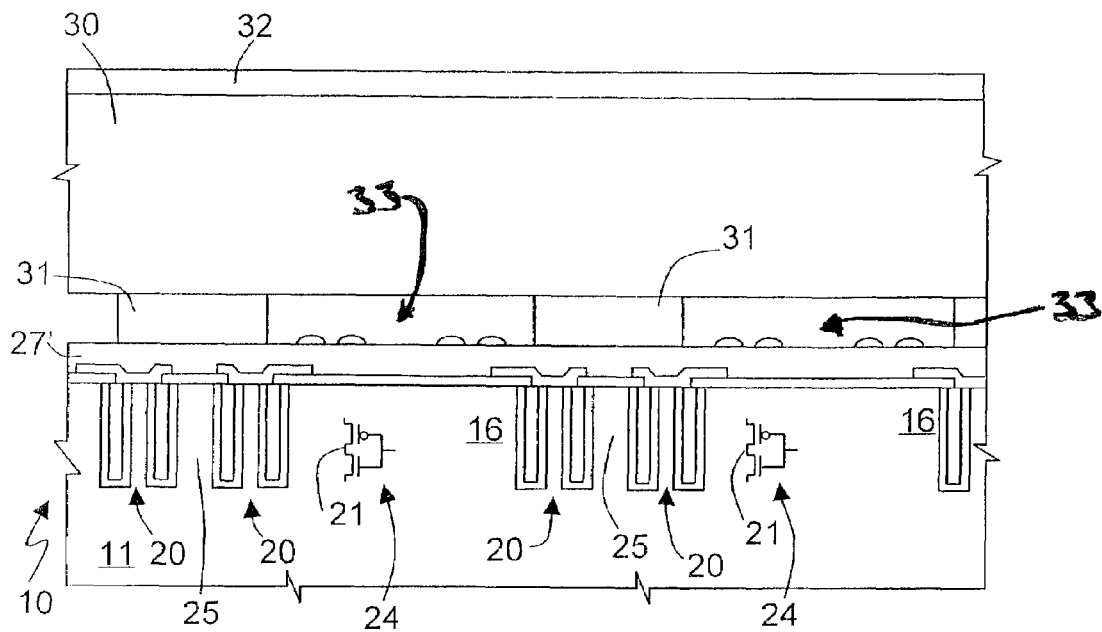
FIGS. 10-12 are cross sections through a composite wafer formed starting from the wafer of FIG. 7 and from the plate of FIG. 9, in successive manufacturing steps according to an embodiment of the invention.

As is illustrated in FIGS. 8 and 9, a transparent plate 30, preferably made of glass and having a thickness of between 200 μm and 1 mm, is then prearranged for being bonded on the wafer 10. In greater detail, a layer of bonding material, for example, dry resist, is deposited on a first face 30a of the plate 30 and is subsequently defined by means of a photolithographic process so as to form a bonding matrix 31. The said bonding matrix 31 has a thickness of, for example, between 10 μm and 30 μm and is substantially shaped so as to overlap the separation regions 25 of the wafer 10. A second face 30b of the plate 30, opposite to the first face 30a, is coated by an anti-reflecting layer 32. The plate 30 is then turned upside down, aligned, and bonded to the wafer 10 so as to form a composite wafer and to seal the optical sensors 24, as is illustrated in FIG. 10.

Alternatively, the bonding matrix 31 can be formed directly on the wafer 10, in particular, above the insulating layer 27, by using a pantograph.

Thanks to the thickness of the bonding matrix 31, gaps 33 separate the plate 30 from the optical sensors 24, so favoring proper transmission of the incident light. In addition, the anti-reflecting layer 32 is arranged at an optimal distance from the front face 15 of the wafer 10, where the photodetectors 21 are located. This distance is substantially equal to the sum of the thicknesses of the bonding matrix 31 and the plate 30 and can reach up to approximately 2 mm.

Figure 11:
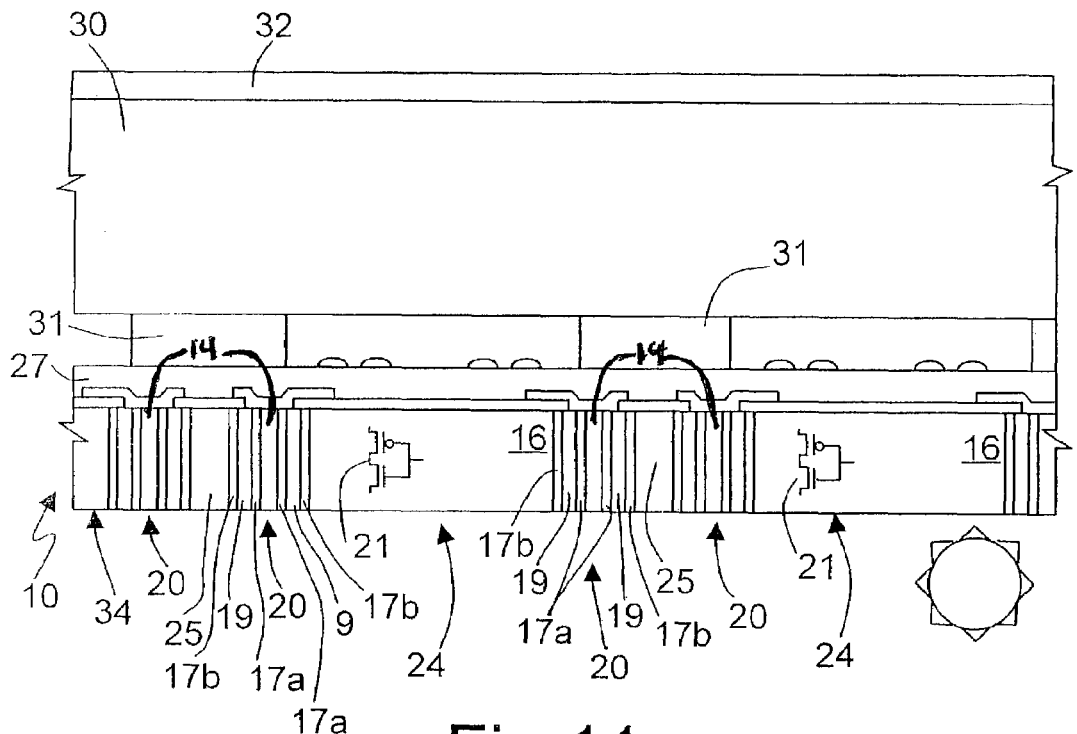

Then (FIG. 11), the wafer 10 is thinned out by grinding until the ends of the through interconnections 20 are uncovered. In this step, in particular, the bottom portions 17c of the highly conductive regions 17 are removed, and then the plugs 14 are electrically insulated from the rest of the substrate 11. In greater detail, by means of the insulating structures 19, the inner annular portions 17a are separated from the respective outer annular portions 17b, embedded in the substrate 11. Furthermore, the plugs 14 and, in particular, the inner annular portions 17a extend between the front face 15 and an opposite rear face 34 of the wafer 10. The through interconnections 20 thus made have a very low resistance value, corresponding, for example, to 100 mΩ.

Figure 12:
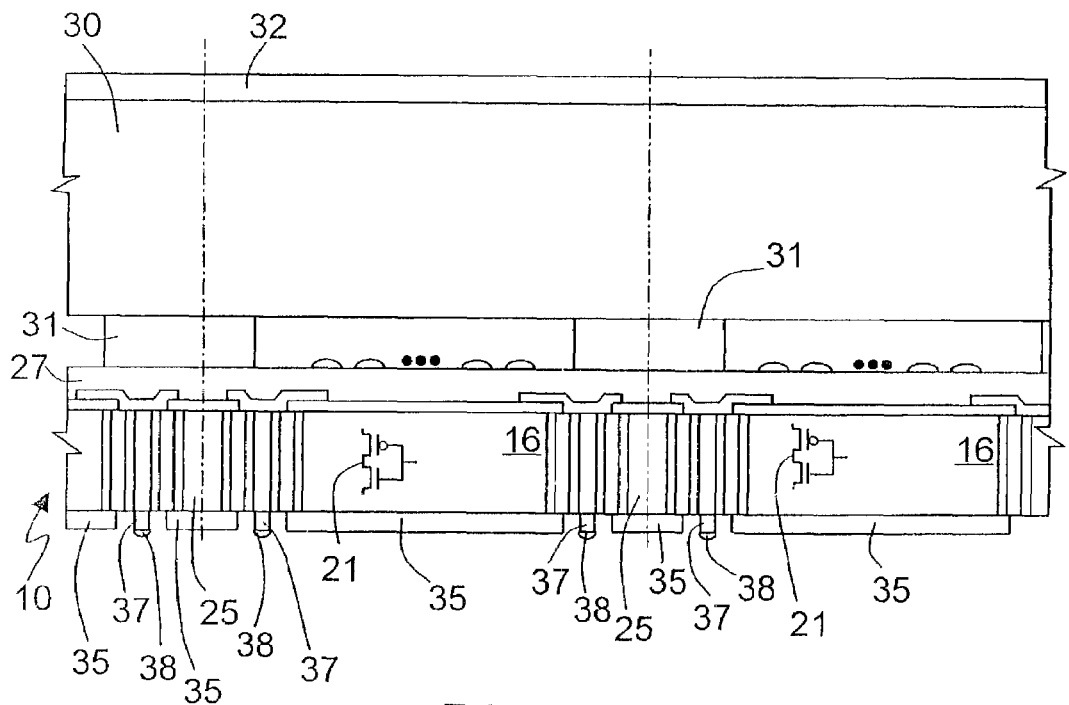

Then, the rear face 34 of the wafer 10 is processed to prepare the individual optical sensors 24 for subsequent standard steps of assembly on respective cards (these steps will be performed after cutting of the wafer 10 and are not described here). In particular (FIG. 12), metal pads 37 are formed, which contact the through interconnections 20 and bumps 38 for electrical connection of the optical sensors 24 to the respective cards. Then, a protective resist layer 35 (solder resist) is deposited on the rear face 34 and defined by means of a photolithographic process, so as to uncover the pads 37 and bumps 38. The protective layer 35 enables subsequent bonding on a card (not illustrated) and, at the same time, prevents any accidental contact of the substrate 11 with conductive paths made on the card.

Figure 13:
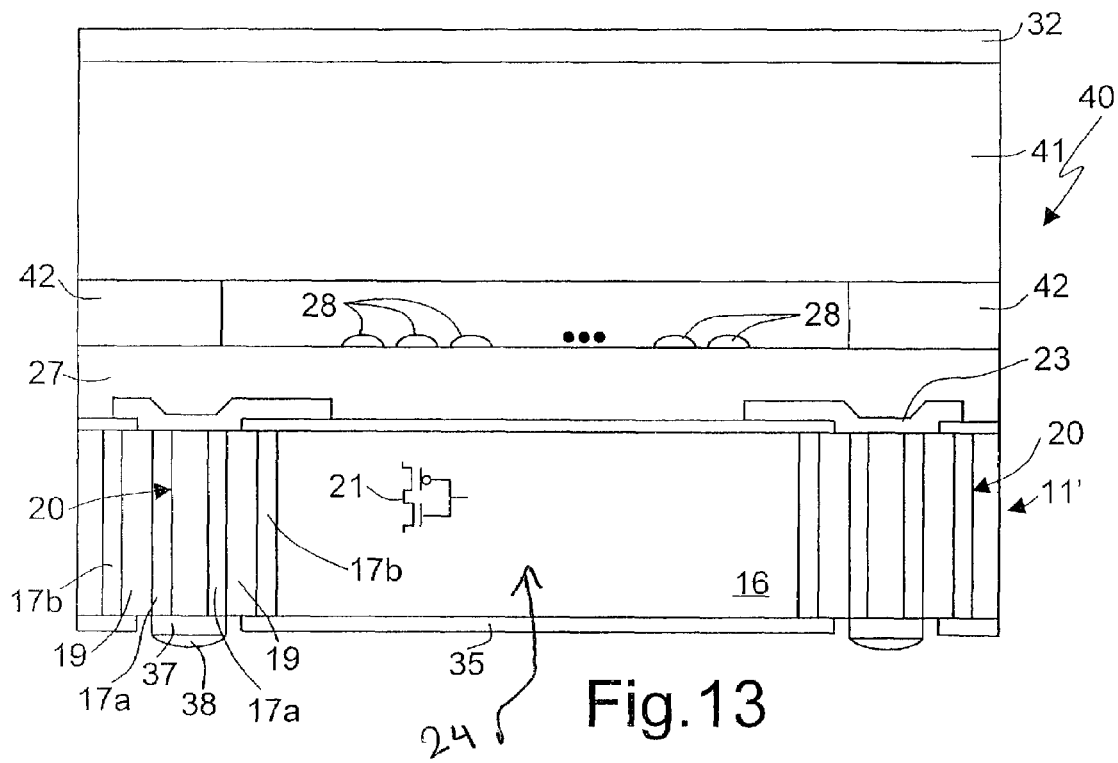
FIG. 13 is a cross section through a die obtained from the composite wafer of FIG. 12 according to an embodiment of the invention.
Figure 14:
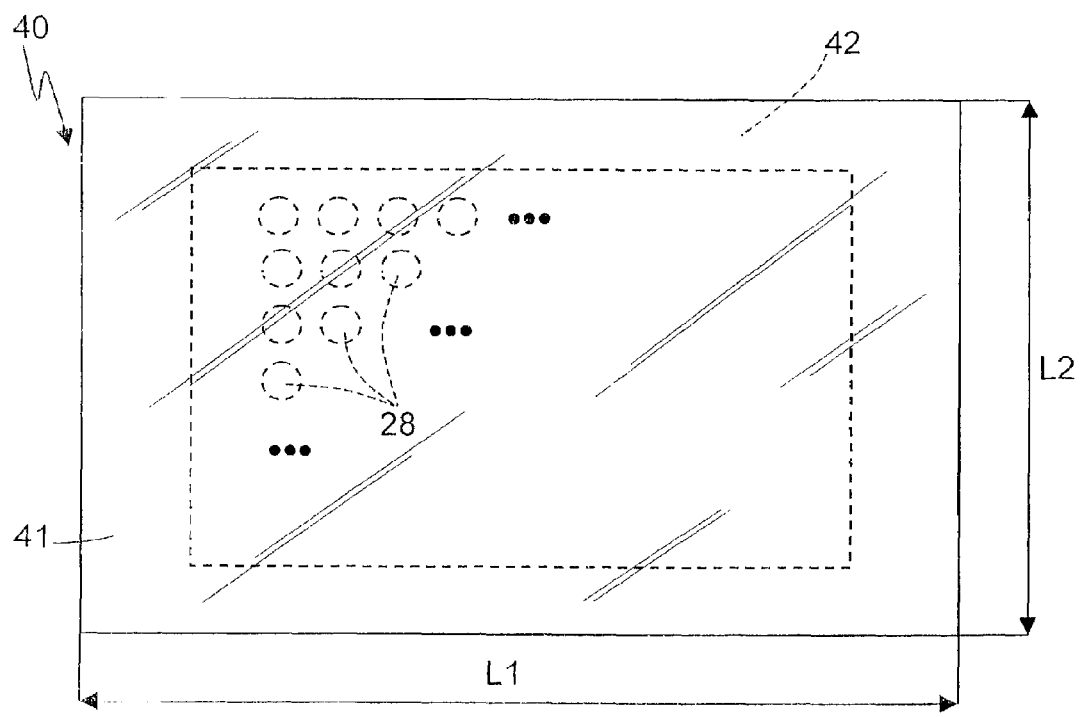
FIG. 14 is a top plan view of the die of FIG. 13 according to an embodiment of the invention.

Using a diamond wheel, the wafer 10 and the plate 30 are then cut along the separation regions 25 (indicated by dashed lines in FIG. 12) and are divided into dies 40. As illustrated in FIGS. 13 and 14, each die 40 comprises a respective portion 11' of the substrate 11, an optical sensor 24, provided with respective micro-lenses 28 and, in addition, respective through interconnections 20 (i.e., the ones adjacent to the active area 16 in which the photodetector array 21 is made). Furthermore, the die 40 is equipped with a chip 41 and with a bonding frame 42, obtained by cutting the plate 30 and the bonding matrix 31, respectively. The chip 41 and the bonding frame 42 seal the optical sensor 24, thus preventing impurities from depositing on the micro-lenses 28. In addition, the portion of substrate 11' housing the optical sensor 24 and the chip 41 have equal width L1 and equal length L2.

From what has been illustrated above, it emerges clearly that the described embodiment of the invention presents numerous advantages.

In the first place, the optical sensors according to the embodiment of the invention are already provided with respective protection structures and do not need to be further encapsulated within hollow protective structures. Consequently, on the one hand, a lower number of manufacturing and assembly steps is necessary and, on the other hand, the overall dimensions are minimized. In fact, the chip 41, which seals the optical sensor 24, has substantially the same area as the sensor itself and, in practice, occupies the minimum space necessary.

The use of through interconnections, instead of the traditional connection lines, in turn enables the production of optical sensors which are compact and have small overall dimensions. Furthermore, the through interconnections can be formed in a simple and reliable way. In particular, the process described enables highly conductive through interconnections to be obtained in a low doping substrate, in which it is, therefore, possible to integrate other electronic components.

Furthermore, the optical sensors are sealed directly during manufacture and, in particular, before cutting of the wafer in which they are formed. In this way, the possibility of contaminating agents damaging the sensors is drastically reduced. As a result, the number of faulty pieces is reduced, and the overall output of the manufacturing process is considerably improved.

A further advantage is provided by the very high precision that can be achieved. In particular, the manufacturing steps used for the formation of optical sensors according to the described embodiment of the invention have extremely low tolerances, and hence the dimensional deviations between different sensors can be substantially neglected. Consequently, in the steps of mounting the optical assemblies, the sensors can be positioned in an optimal way, using only mechanical references. In other words, the precision with which each die can be manufactured is such that the use of mechanical references is sufficient for aligning and focusing the optical assembly with respect to the sensor. Hence, the need for carrying out purposely designed aligning and focusing steps for each individual device is overcome, thus simplifying considerably the manufacturing process and accordingly reducing the costs involved.

It is to be noted that the plate 30 advantageously functions as a support for the wafer 10 during the grinding step, as well as during the subsequent steps. Without the above support, in fact, the wafer 10 might be too thin for it to be able to undergo further machining processes.

Finally, the thickness of the bonding matrix 31 can be easily controlled in order to position the plate 30 in such a way that the anti-reflecting layer 32 is at an optimal distance from the optical sensor 24.

Furthermore, the dies 40 (FIGS. 13 and 14) can be formed into an integrated circuit, which can be incorporated into an electronic system such as a digital camera or other image-capture system.

Finally, it emerges clearly that numerous modifications and variations can be made to the sensor device described herein, without thereby departing from the spirit and scope of the present invention.

In particular, the through interconnections could be obtained following a process different from the one described herein. Furthermore, the bonding matrix can be formed by applying the silk-screen printing process, using materials different from dry resist, such as vitreous pastes or epoxy resins.

What is claimed is:

1. An encapsulated optical sensor, comprising:
    a substrate of semiconductor material having a surface;
    a plurality of photodetectors formed in said substrate and operable to sense light that is incident on the surface;
    a chip of transparent material, carried by said surface of said substrate and sealing said photodetectors; and
    at least one through interconnection traversing the substrate, the through interconnection comprising a conductive region insulated from said substrate by a respective insulating structure.

2. The sensor according to claim 1, further comprising an insulating layer coating said substrate, said chip being bonded to said insulating layer.

3. The sensor according to claim 1, further comprising a gap between said substrate and said chip.

4. The sensor according to claim 1, further comprising a bonding frame arranged between said substrate and said chip.

5. The sensor according to claim 4, wherein said bonding frame has a thickness of between 10 um and 30 um.

6. The sensor according to claim 1, wherein said substrate and said chip have substantially equal width and equal length.

7. The sensor according to claim 1, further comprising a plurality of said through interconnections traversing said substrate.

8. An encapsulated optical sensor, comprising:
    a substrate of semiconductor material;
    a plurality of photodetectors formed in said substrate;
    a plurality of through interconnections traversing said substrate;
    a chip of transparent material, carried by said substrate and sealing said photodetectors; and
    wherein each of said through interconnections comprises a conductive region insulated from said substrate by means of a respective insulating structure.

9. An integrated circuit comprising:
    a semiconductor substrate having a first surface;
    an optical sensor disposed in the substrate and operable to sense light that strikes the first surface of the substrate;
    a frame disposed on the first surface of the substrate around the optical sensor;
    a transparent plate bonded to the frame adjacent to the first surface of the substrate and sealing the optical sensor; and
    an interconnect disposed in the substrate, and including
        a conductor, and
        an electrical insulator disposed between the substrate and the conductor;
    wherein the semiconductor substrate comprises a second surface that is opposite to the first surface;
    wherein the optical sensor comprises a conductive contact disposed on one of the first and second surfaces;
    wherein the interconnect extends from the first surface to the second surface; and
    a conductor that electrically couples the conductive contact to the conductor of the interconnect.

10. The integrated circuit of claim 9 wherein the optical sensor comprises an array of photo detectors.

11. The integrated circuit of claim 9 further comprising a gap between the optical sensor and the transparent plate.

12. An integrated circuit, comprising:
    a semiconductor substrate;

an optical sensor disposed in the substrate;

a frame disposed on the substrate around the optical sensor;

a transparent plate bonded to the frame and sealing the optical sensor; and a plurality of through interconnections traversing the substrate, each of the through interconnections including a conductive region insulated from the substrate by means of a respective insulating structure.

13. The semiconductor structure of claim 12 wherein the frame defines scribe lines for dicing the wafer.

14. The integrated circuit of claim 12, further comprising:

wherein the semiconductor substrate comprises a first surface and a second surface that is opposite to the first surface;

wherein the optical sensor comprises a conductive contact disposed on one of the first and second surfaces;

wherein each interconnect extends from the first surface to the second surface; and a conductor that electrically couples the conductive contact to the conductor of the interconnect.

15. An integrated circuit, comprising:

a semiconductor substrate;

an optical sensor disposed in the substrate;

a frame disposed on the substrate around the optical sensor;

a transparent plate bonded to the frame and sealing the optical sensor; and a plurality of through interconnects traversing the substrate, each of the through interconnects including a respective conductive region insulated from the substrate by a respective insulating structure.

16. The integrated circuit of claim 15 wherein the interconnect extends to the first surface of the substrate.

17. The integrated circuit of claim 15 wherein the substrate and the conductor comprise a same semiconductor material.

18. The integrated circuit of claim 15 wherein the conductor comprises a semiconductor material.

* * * * *